United States Patent
Kang et al.

(10) Patent No.: US 6,989,945 B2
(45) Date of Patent: Jan. 24, 2006

(54) LONG-THROW, TIGHT FOCUSING OPTICAL COUPLER

(75) Inventors: Keith Kang, Hollis, NH (US); John Trezza, Nashua, NH (US)

(73) Assignee: Xanoptix, Inc., Merrimack, NH (US)

( * ) Notice: Subject to any disclaimer, the term of this patent is extended or adjusted under 35 U.S.C. 154(b) by 612 days.

(21) Appl. No.: 10/180,241

(22) Filed: Jun. 26, 2002

(65) Prior Publication Data

US 2003/0086636 A1    May 8, 2003

Related U.S. Application Data

(60) Provisional application No. 60/365,489, filed on Mar. 18, 2002.

(51) Int. Cl.
*H04B 10/12* (2006.01)
*G02B 3/02* (2006.01)
*G02B 6/42* (2006.01)

(52) U.S. Cl. .............. 359/719; 359/341.3; 359/341.33; 385/27

(58) Field of Classification Search ............ 359/341.3, 359/341.33, 719; 385/27, 31, 39; 372/6
See application file for complete search history.

(56) References Cited

U.S. PATENT DOCUMENTS

| | | | |
|---|---|---|---|
| 4,481,403 A | 11/1984 | Del Monte | 219/209 |
| 5,633,967 A * | 5/1997 | Haruta | 385/50 |
| 6,404,542 B1 | 6/2002 | Ziari et al. | 359/341.3 |
| 6,438,150 B1 | 8/2002 | Yoo | 372/49 |
| 6,532,101 B2 | 3/2003 | Islam et al. | 359/334 |
| 6,553,044 B1 | 4/2003 | Eden | 372/38.02 |
| 6,751,379 B2 * | 6/2004 | Capewell et al. | 385/36 |
| 2002/0168139 A1 | 11/2002 | Clarkson et al. | 385/27 |

* cited by examiner

*Primary Examiner*—Timothy Thompson
(74) *Attorney, Agent, or Firm*—Morgan & Finnegan, LLP

(57) ABSTRACT

A long-throw, tight focussing optical coupler has a first passive optical element capable of coupling light between an optical source and an optical destination and a second passive optical element, capable of coupling light between the optical source and the optical destination, located between the first passive optical element and one of the optical source or the optical destination such that, a light beam from the optical source will be transferred to the optical destination when the optical source and optical destination are spaced apart by a distance.

10 Claims, 14 Drawing Sheets

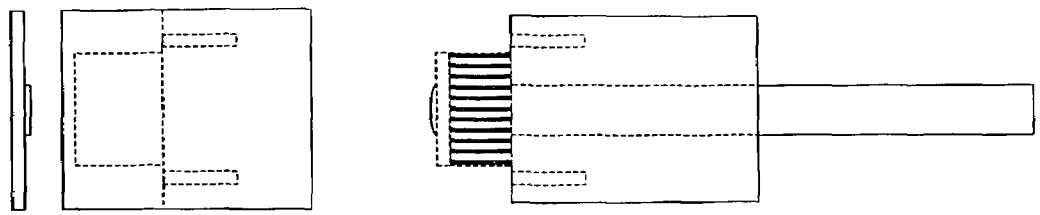
FIG. 20
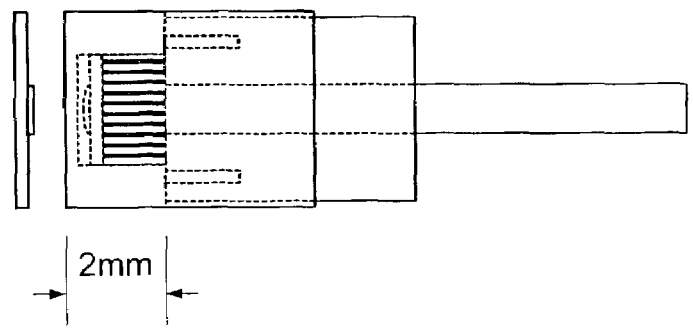
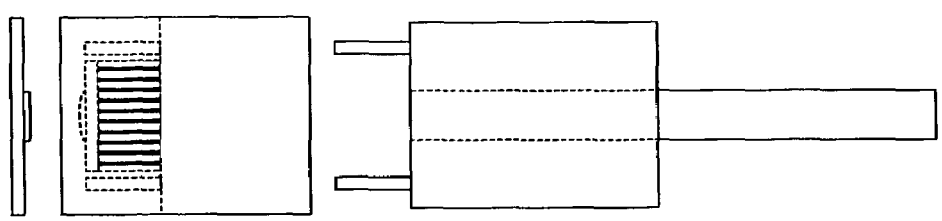
FIG. 21
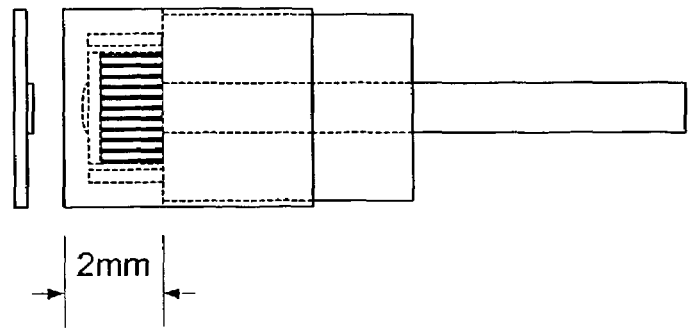

LONG-THROW, TIGHT FOCUSING OPTICAL COUPLER

CROSS PREFERENCE TO RELATED APPLICATION

This application claims priority under 35 USC 119(e)(1) of U.S. Provisional Patent Application Ser. No. 60/365,489 filed Mar. 18, 2002.

This application is also a continuation in part of U.S. patent application Ser. No. 09/896,797 filed Jun. 29, 2001.

FIELD OF THE INVENTION

This invention relates to optical components and, more particularly, to optical components for coupling light between elements.

BACKGROUND

Light, when emitted from a laser, experiences diffraction—the result of which is called "divergence" or a spreading of the light. FIG. 1 is an illustration of light 100 emitted from a laser 102 (mounted on an integrated circuit chip 104) diverging as it approaches an optical fiber 106. Diffraction causes the laser emitted light 100 to expand in a cone shape 108 which, if the distance the light must travel before reaching, an optical fiber 106, for example, is large enough, the light 100 cannot easily be coupled into the optical fiber 106.

Referring now to FIG. 2, as far back as 1997, people have discussed using fiber optic faceplates to eliminate divergence. FIG. 2 shows an example of a faceplate system 200 used to eliminate divergence. However, to be effective, the faceplate 202 must be very close to the optical device, whether it is a laser 204 or a photodetector 206. However, most typical standard or common commercial packaging that surrounds the optical devices, in order to make electrical connections, prevents the a faceplate 202 from being sufficiently close to an optical element to make them a viable choice.

In addition, as shown in FIG. 3, an optical faceplate 302 cannot handle the combination of multiple beams 304, 306 as would be required if multiple devices, for example lasers 308, 310, are intended to couple to the core 312 of a common optical fiber 314, for example, for purposes of device redundancy or combination of multiple wavelengths into the same fiber. This is because a faceplate only transfers input light to its output in a coherent fashion. Thus, as shown in FIG. 3, for a fixed pitch "P" of fibers 314, with a faceplate 302, some of the lasers 308 can not align with the same fibers 314 as other lasers 310 or, as shown, lasers 308 could miss the fibers 314 entirely.

While lenses can be used to refocus light, lenses are difficult to use if there are many lasers or photodetectors that are close together, due to size limitations. Spacing a lens further away from the devices 402, 404 so that a larger lens 406 can be used, such as shown in FIG. 4, allows diffracted light from the beams 408, 410 emitted by the lasers 402, 404 or directed towards photodetectors (not shown) to interact 412 causing the optical equivalent of electrical "crosstalk" between the signals.

If a lens can be placed close enough to the devices (i.e. closer than would allow crosstalk), then light can be focused. However, using a simple lens system 500, such as shown in FIG. 5 still limits the distance "D" that a fiber 502 can be from a device 504.

As shown in FIG. 6A, if a fiber 602 is close enough to the lens 604 and the lens 604 is close enough to the device 606, the light 608 will enter the core 610 of the fiber 602. If, as shown in FIG. 6B, a fiber 602 is too far away from the lens 604, even light collimated or focused by a lens 604 eventually diffracts, resulting in divergence 612 and hence the same overall difficulty.

Using standard fabrication technologies, slightly more complicated lens arrangements can be made, such as shown in FIG. 7, that can extend the distance somewhat, such as shown in FIG. 7A. However, even then, there is a limit to the distance that the fiber can be from the optical device because, as shown in FIG. 7A, the light still eventually diffracts, resulting in divergence 702 and hence the same overall difficulty. Moreover, more complicated lens arrangements, for example, the one in FIG. 7B that adds a second lens piece 704, requires accurate alignment of the second lens piece 704 relative to the first 706.

FIG. 8A is an example of a common commercially available optical connector 800, such as MPO, MPX, MTP, SMC, MT, MT-RJ, etc. connector. The connector is made up of two connector pieces 802, 804 that interconnect. One of the pieces, called a plug 802, is a male-format piece, because it contains precisely spaced and sized alignment features such as guide plates, posts alignment pins, also called guide pins 806, or other alignment feature(s) that coincide with recesses 808 in the female-format mating piece 804. When the two pieces are brought together, as in FIG. 8B, the guide pins 806 slot into the recesses 808 to ensure and maintain alignment between the two pieces 802, 804.

FIG. 9 shows an alternative arrangement 900 of the common commercially available optical connector 800 of FIGS. 8A and 8B. The difference between the connector of FIG. 9 is that the plug 902 is a female-format piece and the receptacle 904 is the male-format piece that contains the guide pins 906.

Industry today uses one, or at most a small number of, optical devices, for example lasers or photodetectors. As such, all of the optical devices readily fit in between the guide pins/guide pin holes of those connectors. Hence, due to the small number of devices the optical devices can be placed on another surface and the connector plugged directly into that other surface so that the fibers can be brought close to the optical devices. However, where large numbers of devices are used, the approach is not scaleable because with larger numbers of devices, areal the extent of the optical devices gets larger than the spacing of the alignment or guide pins that are used in the connectors for alignment purposes.

When large arrays of optical devices are being used, the requirements of standards-based or common commercially available fiber optic connectors dictate that the fibers will be at least a few millimeters from the optical devices. This is far enough so that that the problems discussed above become extremely problematic. The reason for this distance requirement stems from the typical use, in multi-fiber connectors, of the same type of guide or alignment pins in the connectors. FIG. 10 shows two typical commercially available optical connectors 1000, 1002. The first has a female-format plug 1004, whereas the second has a male-format plug 1006. As can be seen in FIG. 10, the guide pins 1008, 1010 protrude from one end of the connector 1006, 1012 and are inserted into the mating connector piece 1014, 1004 to ensure and maintain alignment. The length of these pins 1008, 1010 typically extends about 2 millimeters or more in length beyond the end 1016, 1018 of a connector piece 1012, 1006 thereby forcing any receptacle plug 1004 attached near the optical devices 1020 to be thick enough to accept these pins 1008 when the receptacle 1004 is a female-format one. The same is true if the plug 1006 is the male-format end of the connector 1002, except in this case, the base 1014 of the connector piece must be thick enough to support the guide or alignment pins 1010.

Typical single or double lens systems made with small lenses (microlenses) whether conventional refractive or diffractive ones cannot handle this distance. For typical semiconductor laser geometries, distances of 0.2 millimeters (or about 10% of the distance desired) can be appropriately handled.

Thus, there is a need for a simple mechanism to transfer light from a device array to a fiber array that is small enough in size to be incorporated into a standards-based or common commercially available connector.

SUMMARY OF THE INVENTION

We have devised a way to couple optical devices, such as lasers and/or detectors, with optical fibers in connectors where the distance between optical devices and the fibers is longer than typical lens schemes can support.

In accordance with our invention, we use a combination of lens technology and optical faceplate technology to extend the reach of the optical signals further than what was previously possible with either alone. Moreover, we have devised a way of doing so that allows for larger numbers of devices to be used with standards-based or common commercially available connectors than had previously been possible.

Advantageously, using the invention makes it possible to deploy optical components in connectors for use with optical devices in which the extent of the optical devices is larger than the distance between alignment features within the optical connector.

A further advantage realizable through use of our invention is that it becomes possible to use lens systems in the aforementioned connector systems. This allows, in some variants, for the changing of numerical aperture (divergence angle). This also allows, in some variants, for the combining of multiple beams together, for example, where redundant optical devices or two or more wavelength devices are to couple to a common fiber.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

FIGS. 20 and 21 show, respectively, a female-format plug and a female-format base employing an example implementation of a long-throw, tight focussing optical couple constructed according to the teachings of the invention.

DETAILED DESCRIPTION

In overview, we use a combination of lens technology and optical faceplate-type technology to extend the reach of the optical signals further than what was previously possible with either alone.

Specifically, we combine either simple or complex microlens arrays made with existing prior art technology with either optical "windows" or optical faceplates. The lens arrays focus the light while the optical windows or faceplates allow the light to travel the necessary distance.

Figure 1:
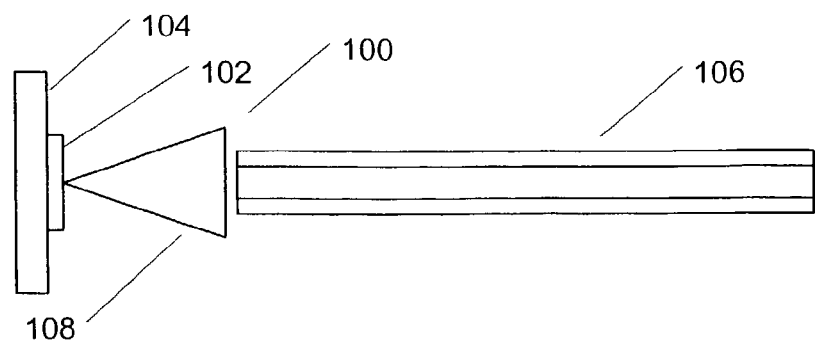
FIG. 1 is an illustration of light emitted from a laser diverging as it approaches an optical fiber.
Figure 2:
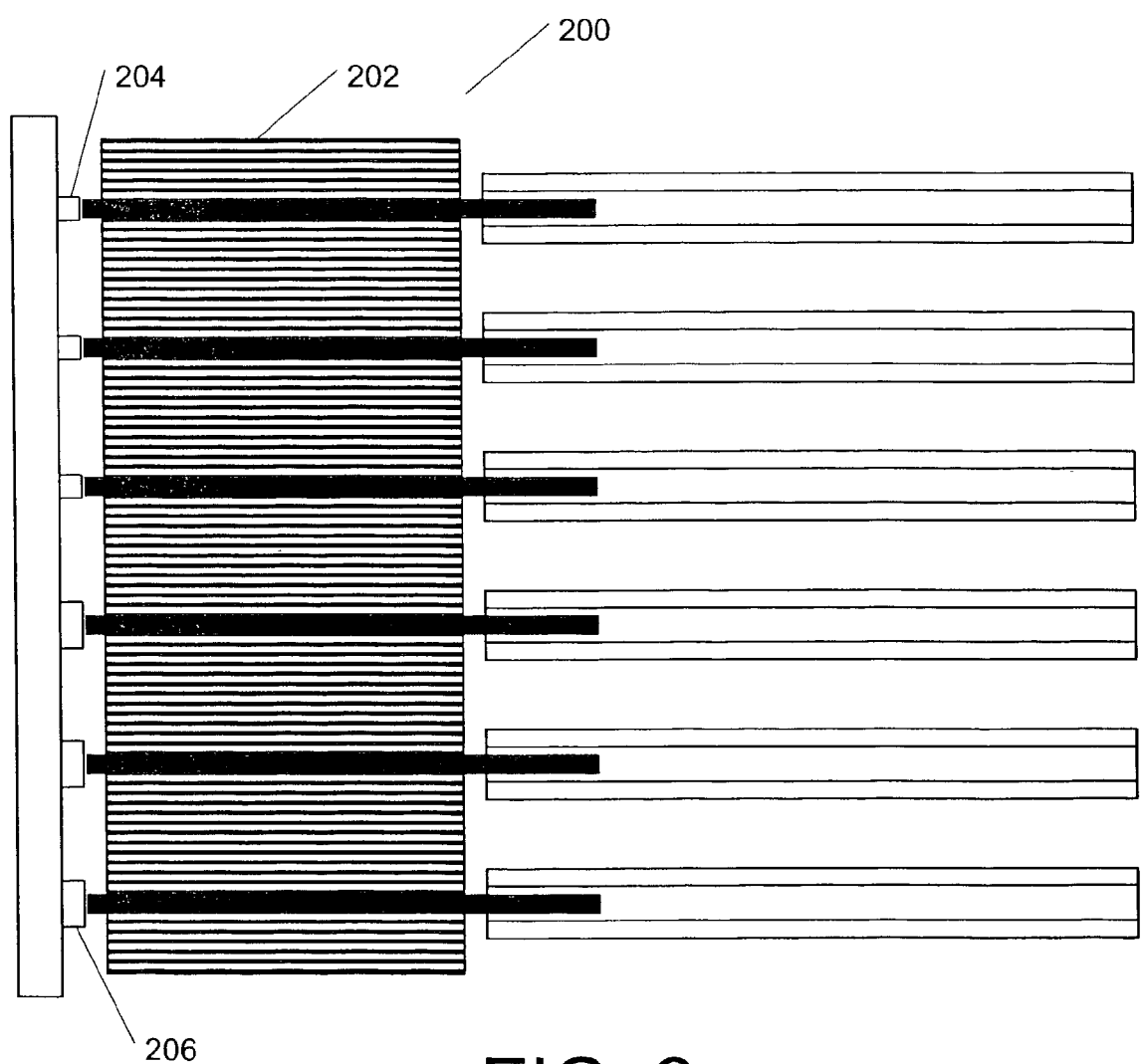
FIG. 2 is an example of a faceplate system used to eliminate divergence.
Figure 3:
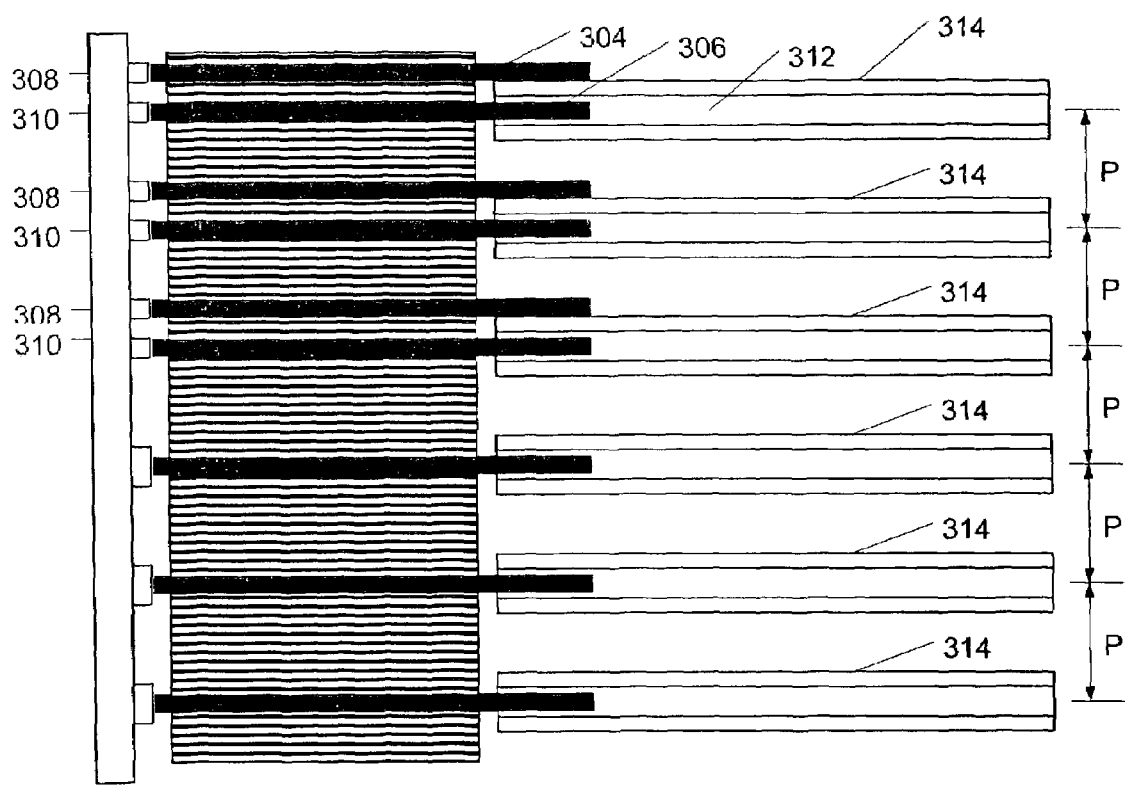
FIG. 3 shows how an optical faceplate cannot handle combination of multiple beams.
Figure 4:
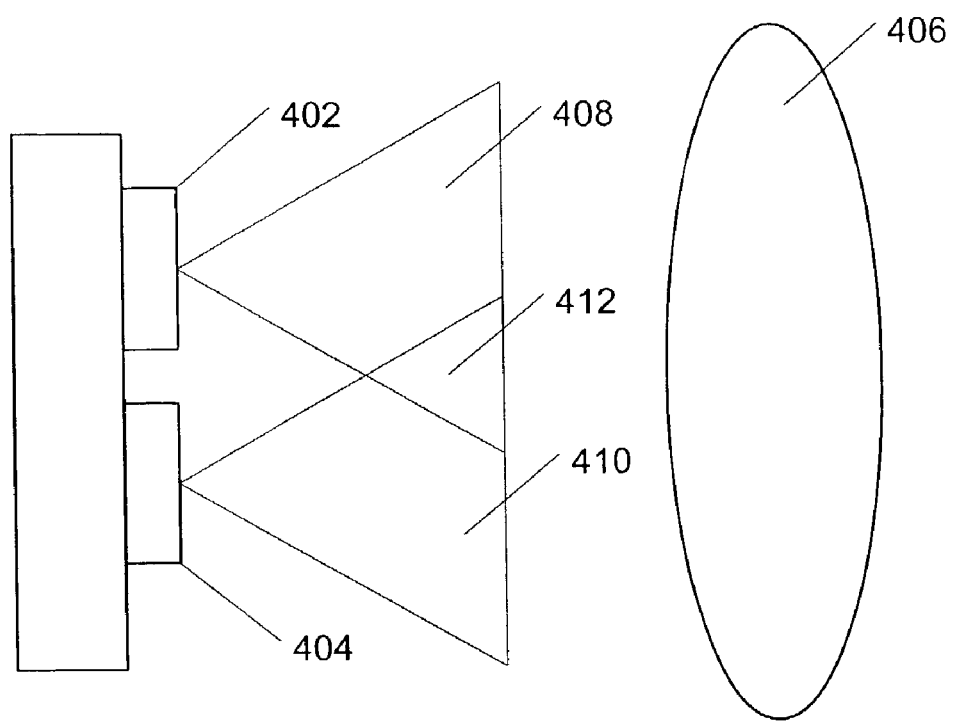
FIG. 4 shows diffracted light from beams emitted by lasers interacting to cause the optical equivalent of electrical "crosstalk" between the signals.
Figure 5:
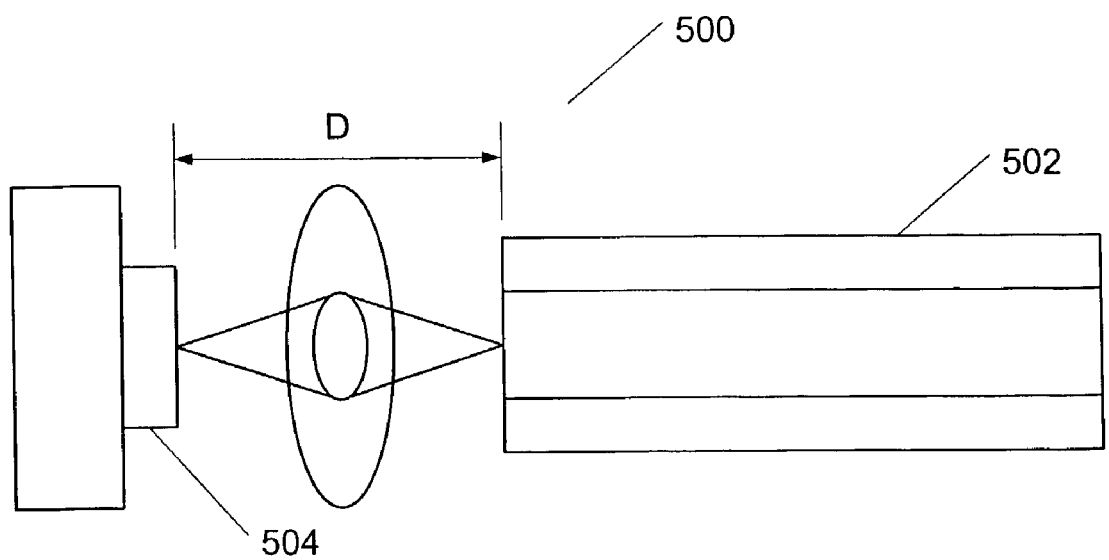
FIG. 5 shows that a simple lens system extends but still limits the distance that a fiber can be from a device.
Figure 6:
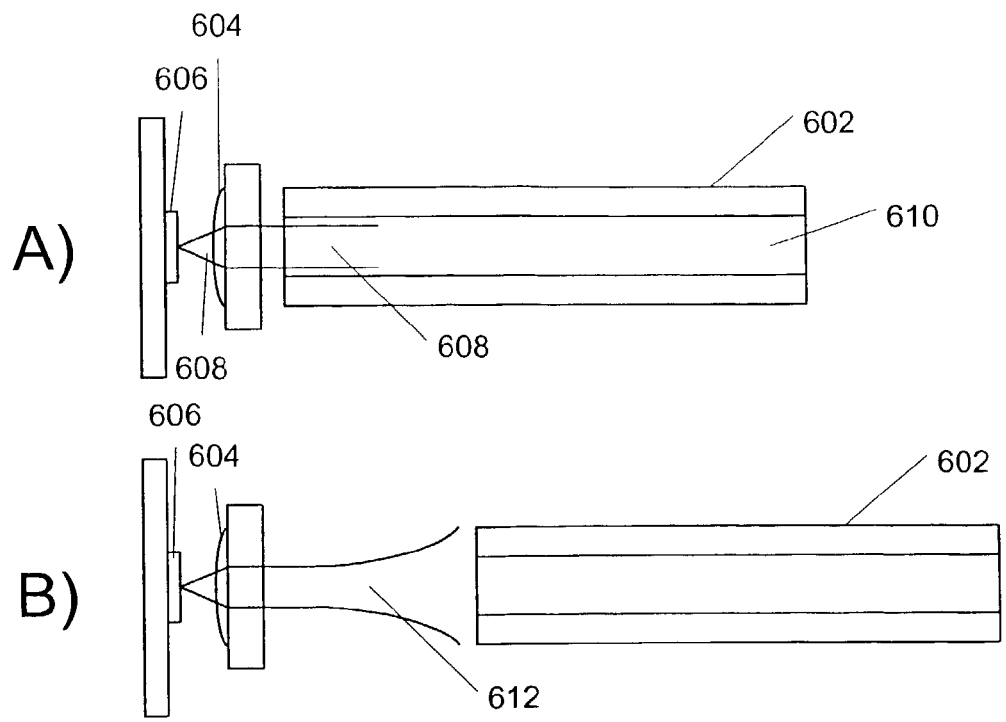
FIG. 6A shows that if a fiber is close enough to a lens and a lens is close enough to a device, light will enter the core of a fiber.
FIG. 6B shows that when a fiber is too far away from a lens diffraction affects coupling.
Figure 7:
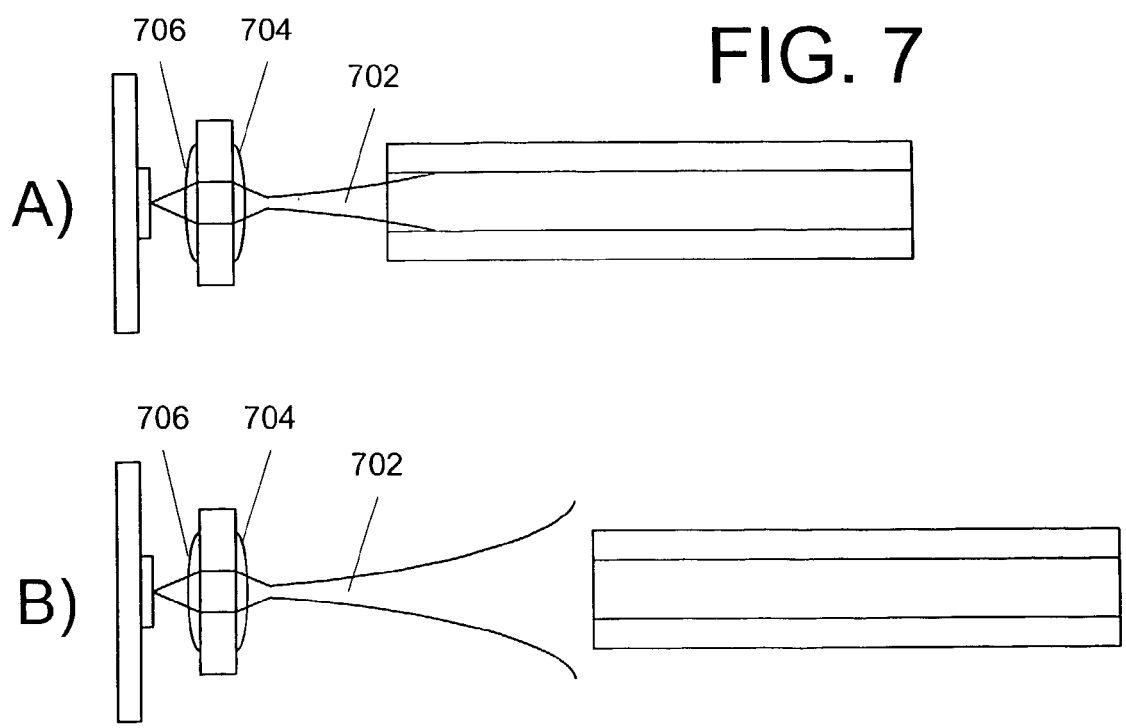
FIG. 7A shows a slightly more complicated lens arrangement.
FIG. 7B adds a second lens piece to the arrange of FIG. 7A.
Figure 8:
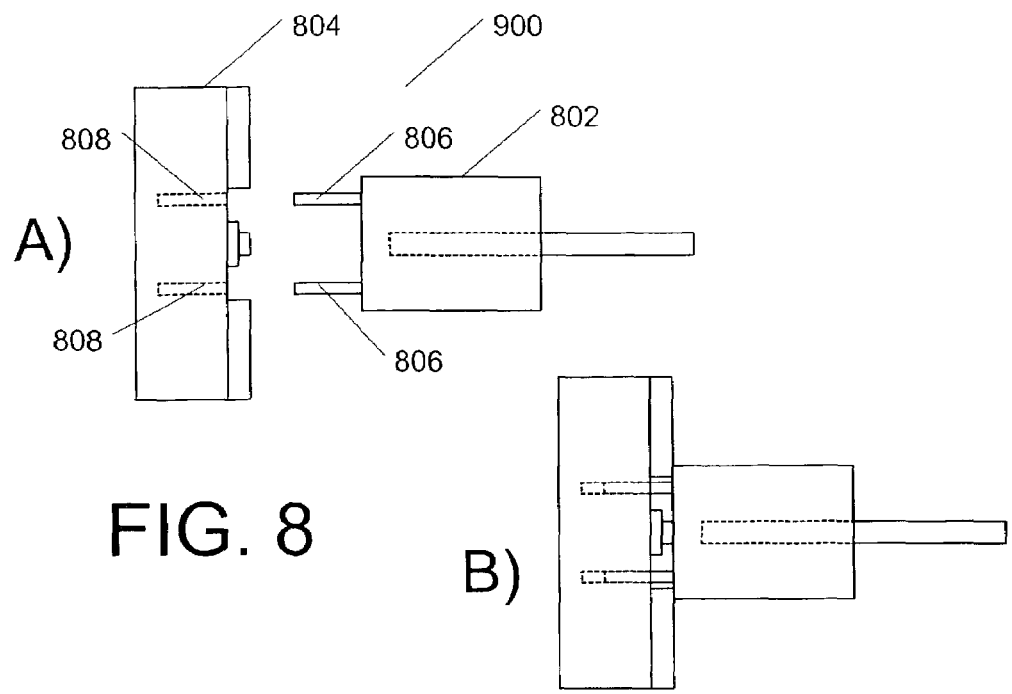
FIG. 8 is an example of a common commercially available optical connector.
Figure 9:
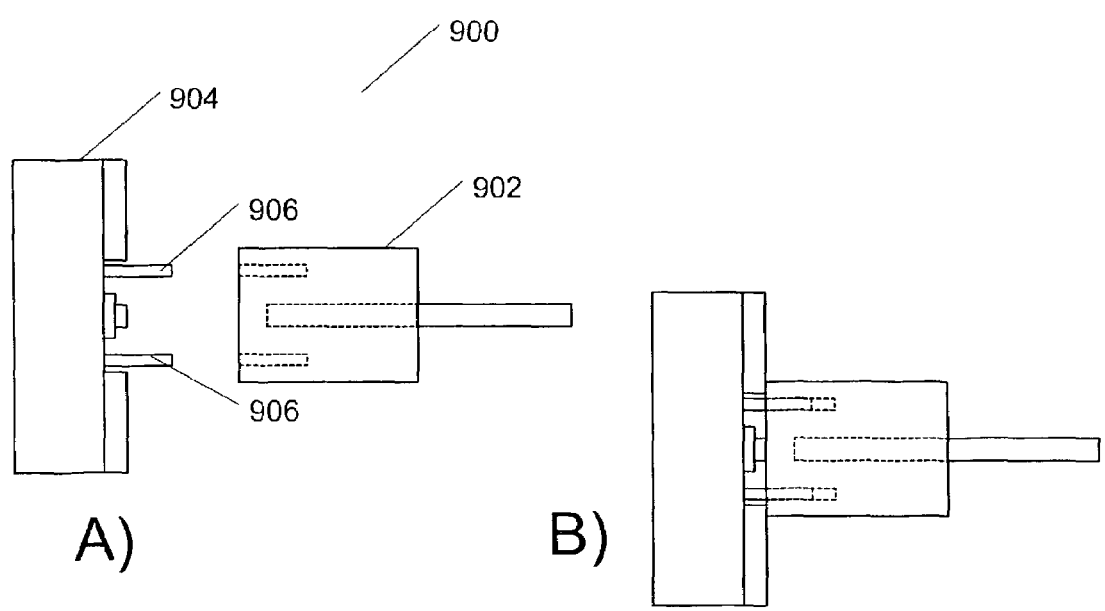
FIG. 9 shows an alternative arrangement of the common commercially available optical connector of FIGS. 8A and 8B.
Figure 10:
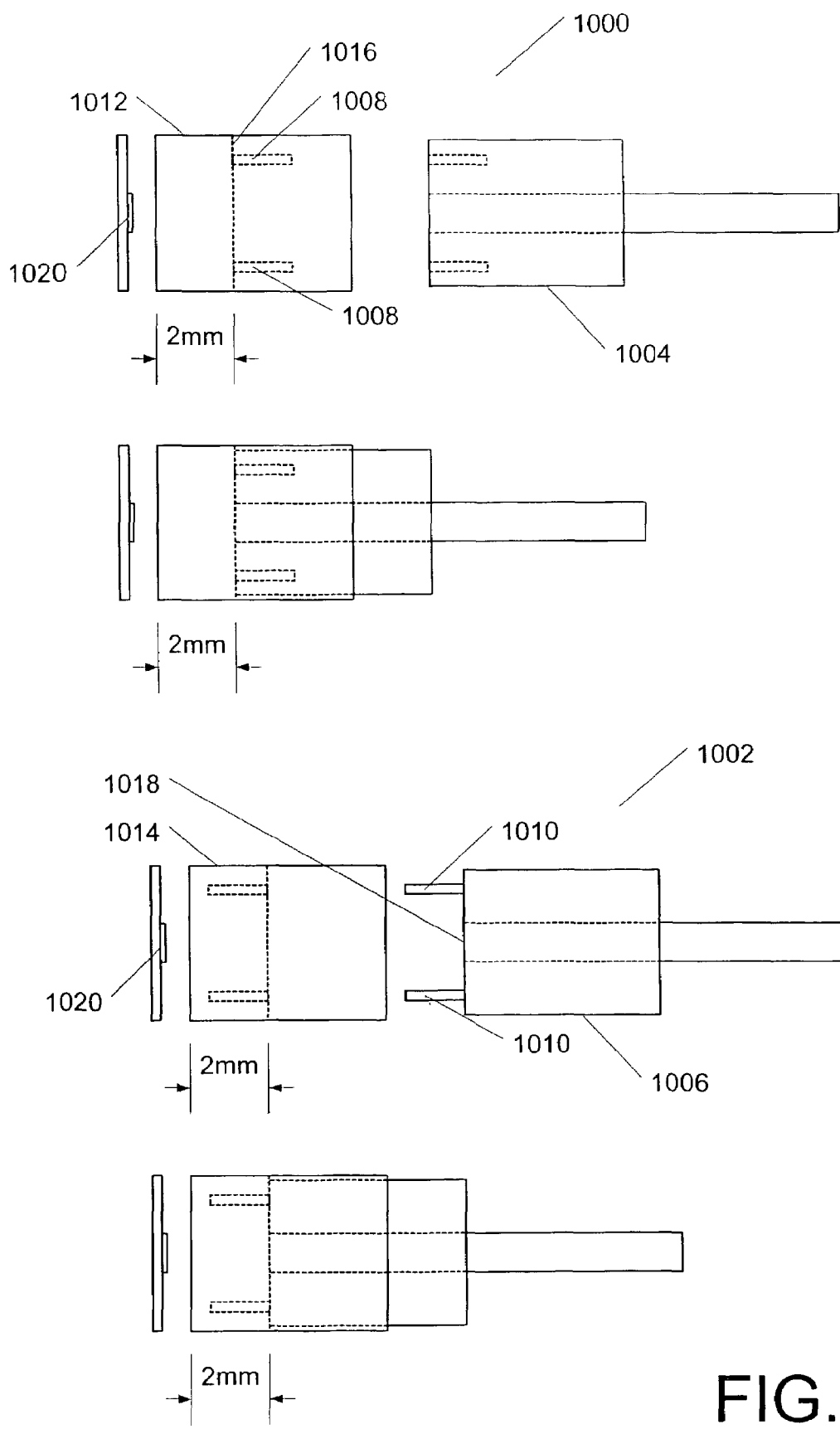
FIG. 10 shows two typical commercially available optical connectors.
Figure 11:
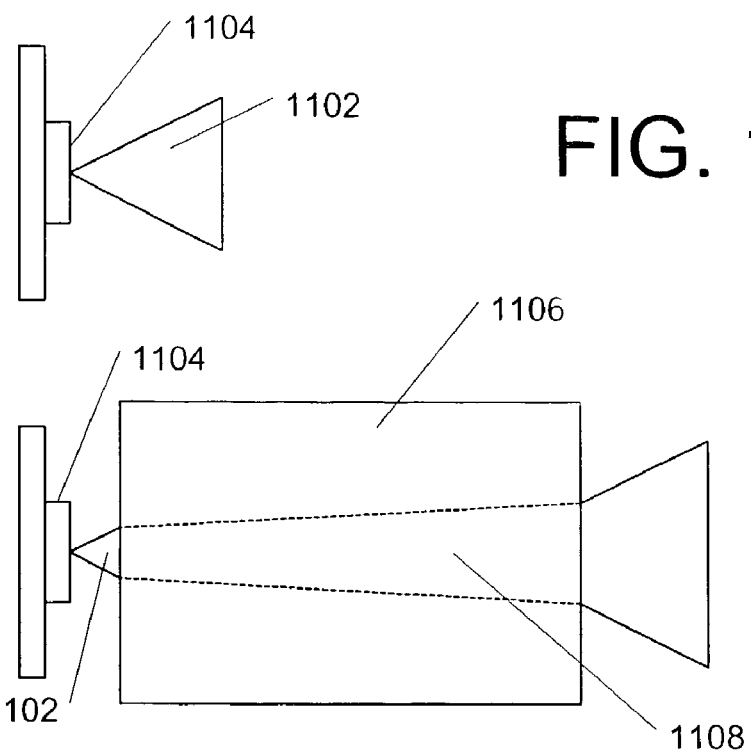
FIG. 11 shows an optical window extending the reach of a beam from a laser.

Optical windows are high refractive index, transparent pieces of material. The high refractive index of the material slows the rate of diffraction of beams, limiting the speed at which a beam diverges or converges over distance. Thus, as shown in FIG. 11, where a beam 1102 emitted from a laser 1104 would diverge in a specific distance, by having the beam 1102 couple with an optical window 1106, the divergence 1108 is less pronounced and hence a greater distance will be traveled by the light before it has diverged as much as it would have in air.

Faceplates are structures, typically used for image enhancement in camera systems. They consist of a packed set of optical fibers. Each fiber is smaller than the size of the optical beam that will pass through it so that there are multiple fibers per image element (pixel). In this way, light entering the structure is transmitted to the other side without expansion. Thus, as shown in FIG. 12, by using a simple lens 1202 with a faceplate 1204 a beam of light from a laser 1206 can travel much further to couple with a core 1208 of an optical fiber 1210 than it could in air.

Moreover, by use of a compound lens arrangement, in this case two lenses 1202, 1212, the faceplate 1204 can be spaced even farther from the laser 1206 and coupling to a fiber core 1208 can be achieved.

Figure 12:
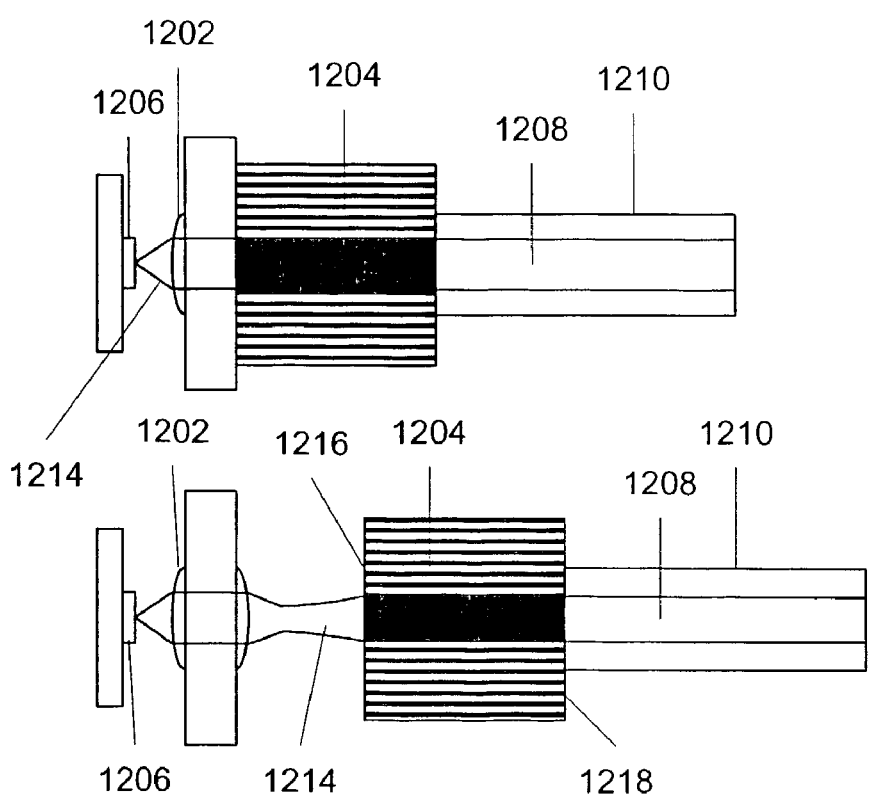
FIG. 12 is a simple lens and a faceplate combination according to the teachings of the invention.

Note however, that in the examples of FIG. 12, the fiber should be placed so as to be close to or abut the edge of the faceplate. This is to ensure that the maximum amount of light is transferred from the faceplate to the fiber. Of course, in some applications, this may not be possible. Advantageously, even in those applications, benefits of the invention can be achieved even though some light may be lost between then faceplate and fiber.

In the example of FIG. 12, The lens element (whether simple 1202 or compound 1202, 1212) does all of the coupling between the optical device 1206 and the fiber 1210 and the faceplate 1204 transfers the "image" of the beam 1214 from one end 1216 of the faceplate 1204 to the other 1218 (in the case of an array of optical devices and fibers, it transfers the image plane between each of the multiple devices and each corresponding fiber in a group of fibers).

Although the discussion thus far has focussed on transferring light from a laser to a fiber, the same principles apply for detectors and fibers. Moreover, this approach can be generalized to other cases irrespective of the source of the light. Thus, the approach can be used for fiber-to-fiber coupling, passive optical element-to-passive optical element coupling, fiber-to-passive optical element coupling, or any other such combination of active or passive optical devices, elements or fibers.

By applying the teachings of the invention, more complex applications of this concept become possible.

One such example is use of the above concepts in a system that includes redundant active optical devices or a device with redundant active regions. Such an arrangement has the advantage of being able to fail over to another device when one device fails. An example of such a system is described in commonly assigned U.S. patent application Ser. No. 09/896,797, filed Jun. 29, 2001, the entirety of which is incorporated herein by reference.

Figure 13:
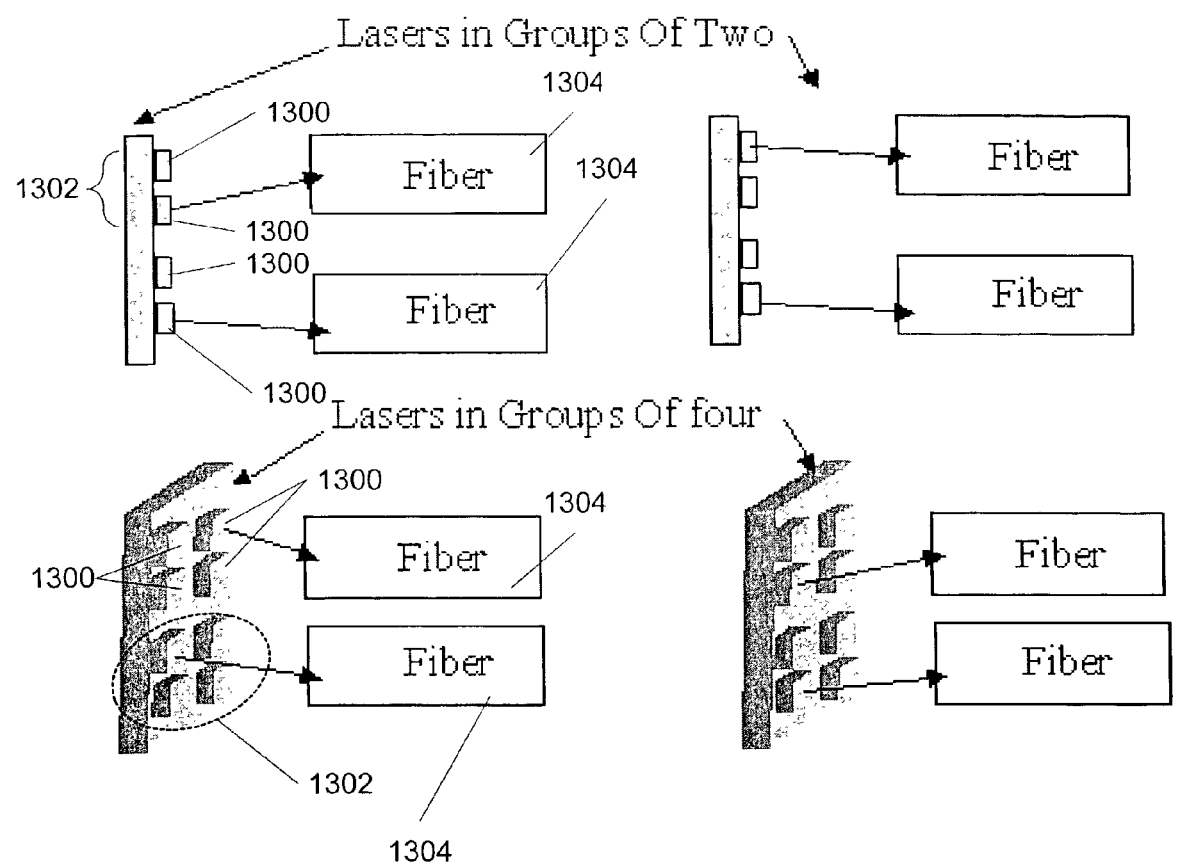
FIG. 13 shows portions of two example systems having redundant lasers.

FIG. 13 shows portions of two example systems having redundant lasers. The lasers 1300 are "grouped" into regions 1302 with each region 1302 associated with a single fiber 1304. Although FIG. 13 conceptually shows setups with groupings of two devices per group and four devices per group, groupings of other even or odd numbers of devices are, of course, possible. Moreover, although FIG. 13 depicts lasers, the approach would operate in a straightforward analogous manner to what is described.

If all of the devices, in this case lasers 1300 in a region 1302 are of the same wavelength (or in the case of detectors, sensitive to the same wavelength) then, in operation, only one device 1300 will be used at a time, with the others in the region being held in reserve as backups. In the case where lasers 1300 in a region 1302 are different wavelengths, any or all of the devices in a group having different wavelengths can be operated simultaneously, with all of the signals from all of the operating lasers in each group going into a single fiber, or all of the detectors receiving the signals from a common fiber.

Transceivers contain both detectors and as lasers in one module or unit. Advantageously, in a transceiver, the teachings of the invention can be applied for use with both lasers and detectors. Moreover, for transceivers employing device redundancy or multiple wavelengths in a group, lens techniques can be used to direct beams from each of the multiple lasers to a common spot with a faceplate being used to then extend the reach of the beam for efficient coupling, for example, into an optical fiber.

Figure 14:
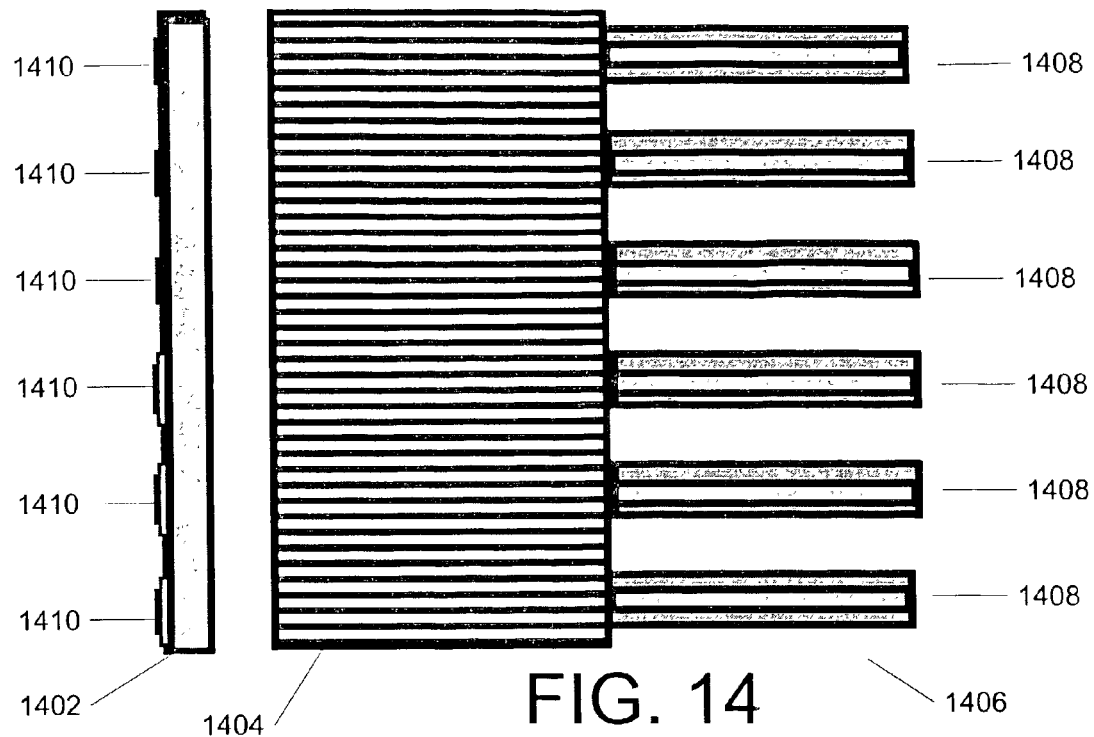
FIGS. 14 through 16 show the components and an example of the operation of a design implementation according to the teachings of the invention.
Figure 15:
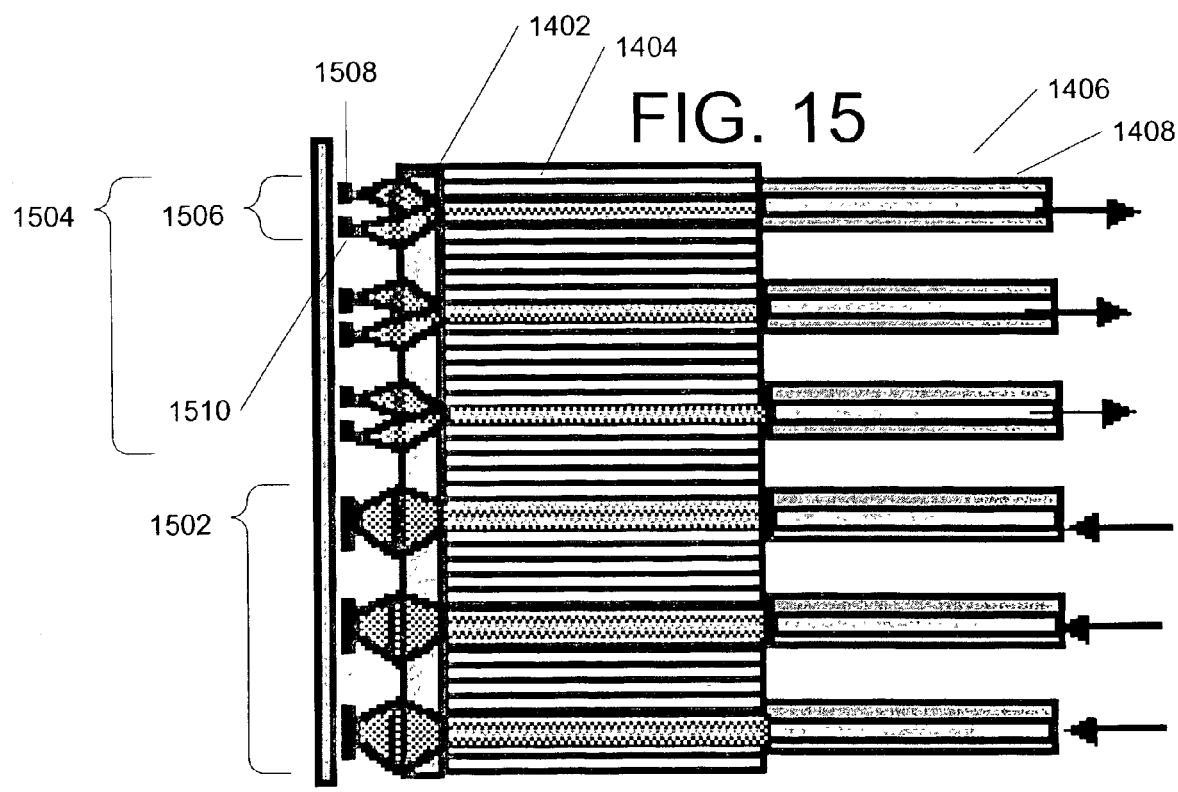
Figure 16:
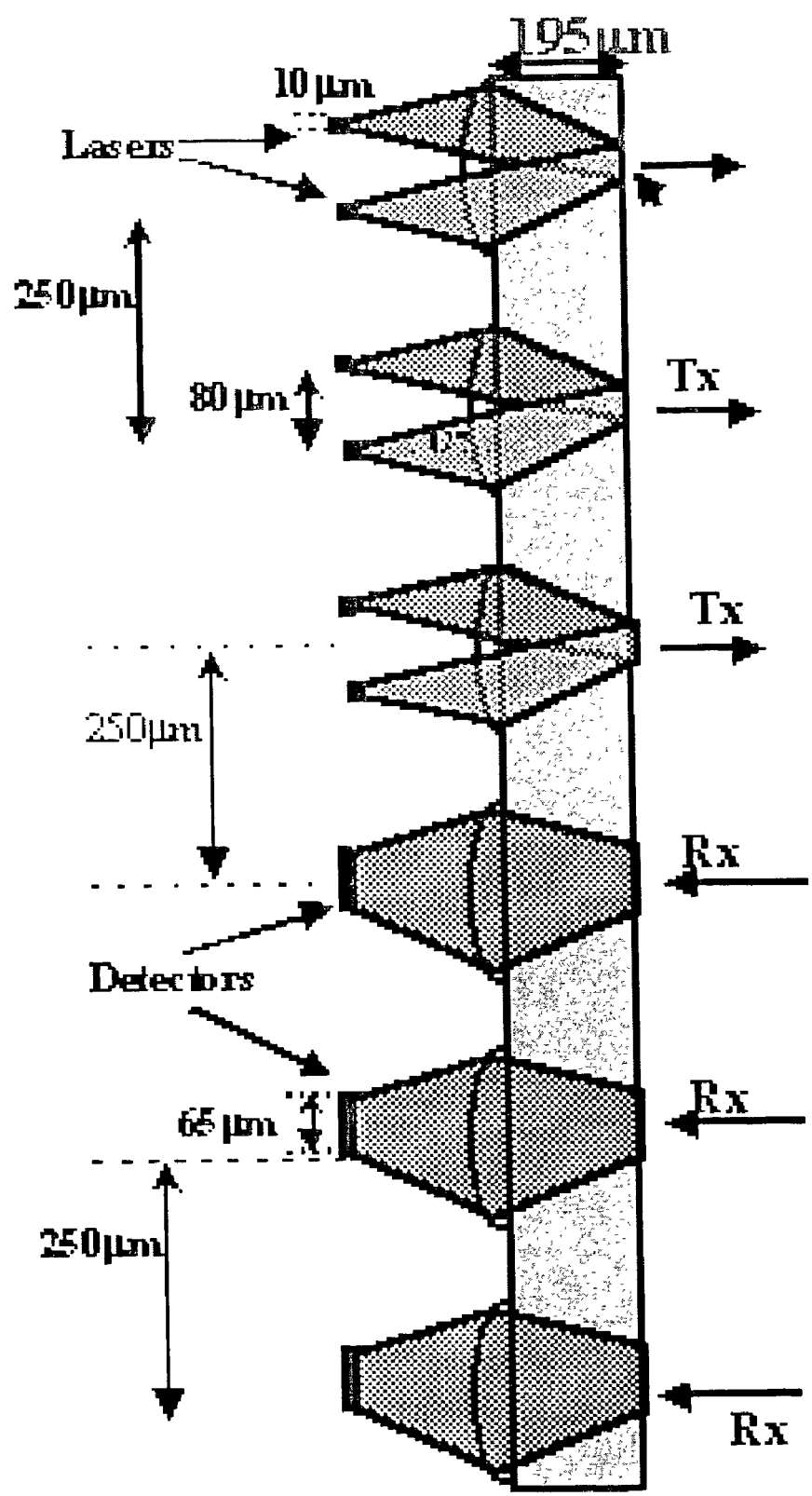

FIGS. 14 through 16 shows the components and an example of the operation of a design implementation according to the teachings of the invention. FIG. 14 shows a simple lens array 1402, a faceplate 1404 and an array 1406 of individual fibers 1408. FIG. 15 is an illustration of the components of FIG. 14 in use with an optical transceiver having an array of detectors 1502 and an array of lasers 1504. As shown in FIG. 15, the lasers are in groups 1506 of two lasers 1508, 1510 per group 1506 with each laser 1508, 1510 in the group 1506 having a different wavelength, while the detectors 1502 are each coupled to an individual fiber 1408. The lenses 1410 in the array 1402 focus, and in the case of the lasers combine, the beams and the faceplate 1404 keeps the light collimated until the light can reach the optical fiber 1408.

FIG. 16 is a close up view of a portion of FIG. 15, showing the light beams of each laser interacting with the lens array and identifying, by way of example, the typical spacings, sizes and beam divergence of the arrangement.

Figure 17:
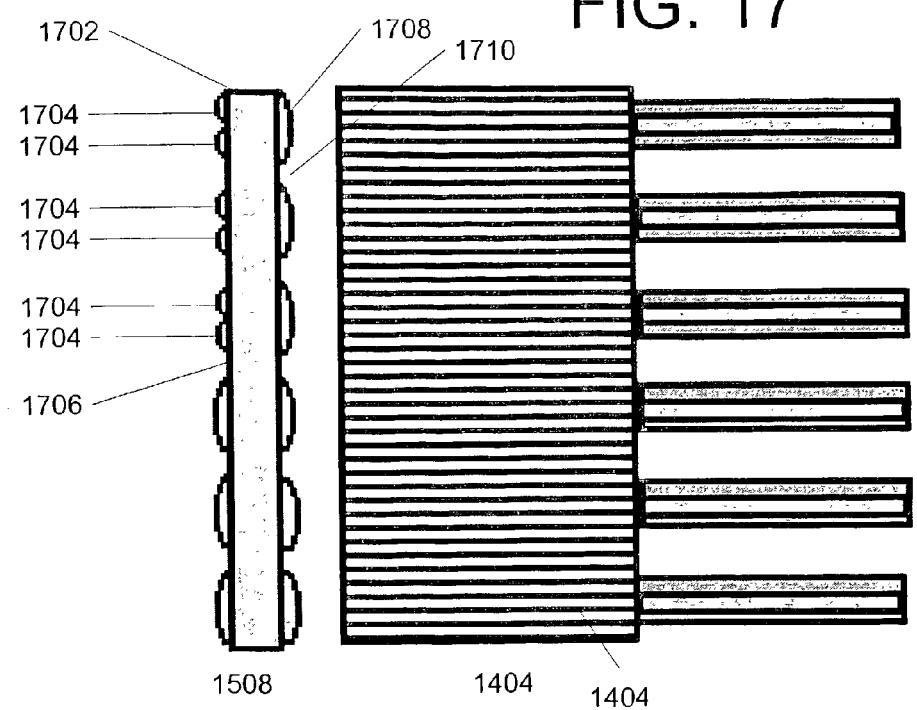
FIGS. 17 through 19 shows an example implementation of a system similar to that of FIGS. 14 through 16 according to the teachings of the invention.
Figure 18:
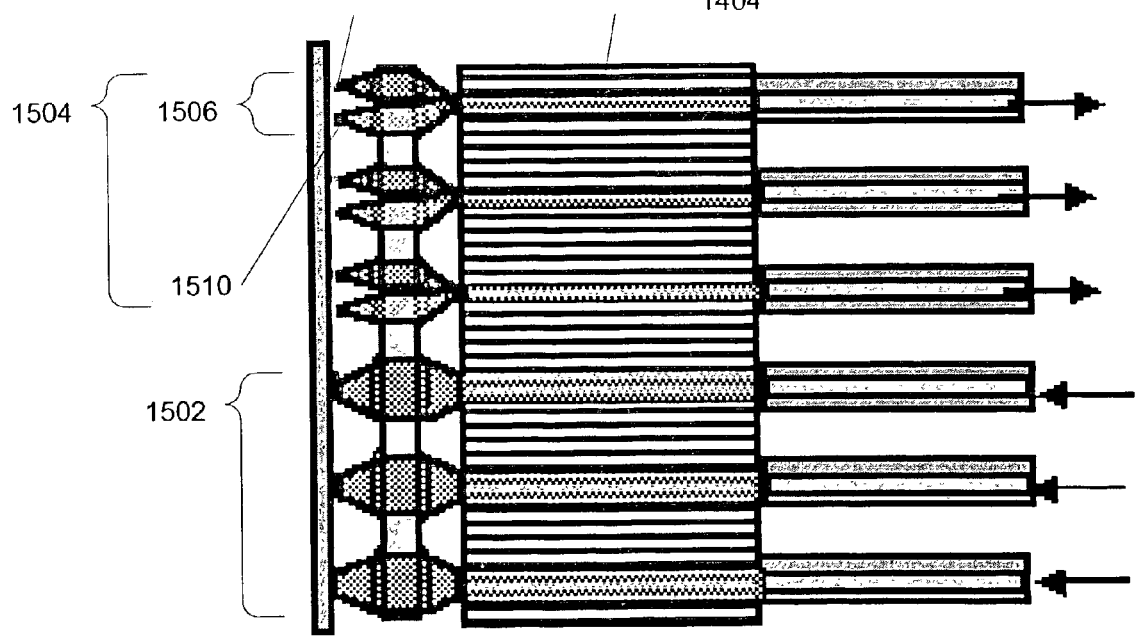
Figure 19:
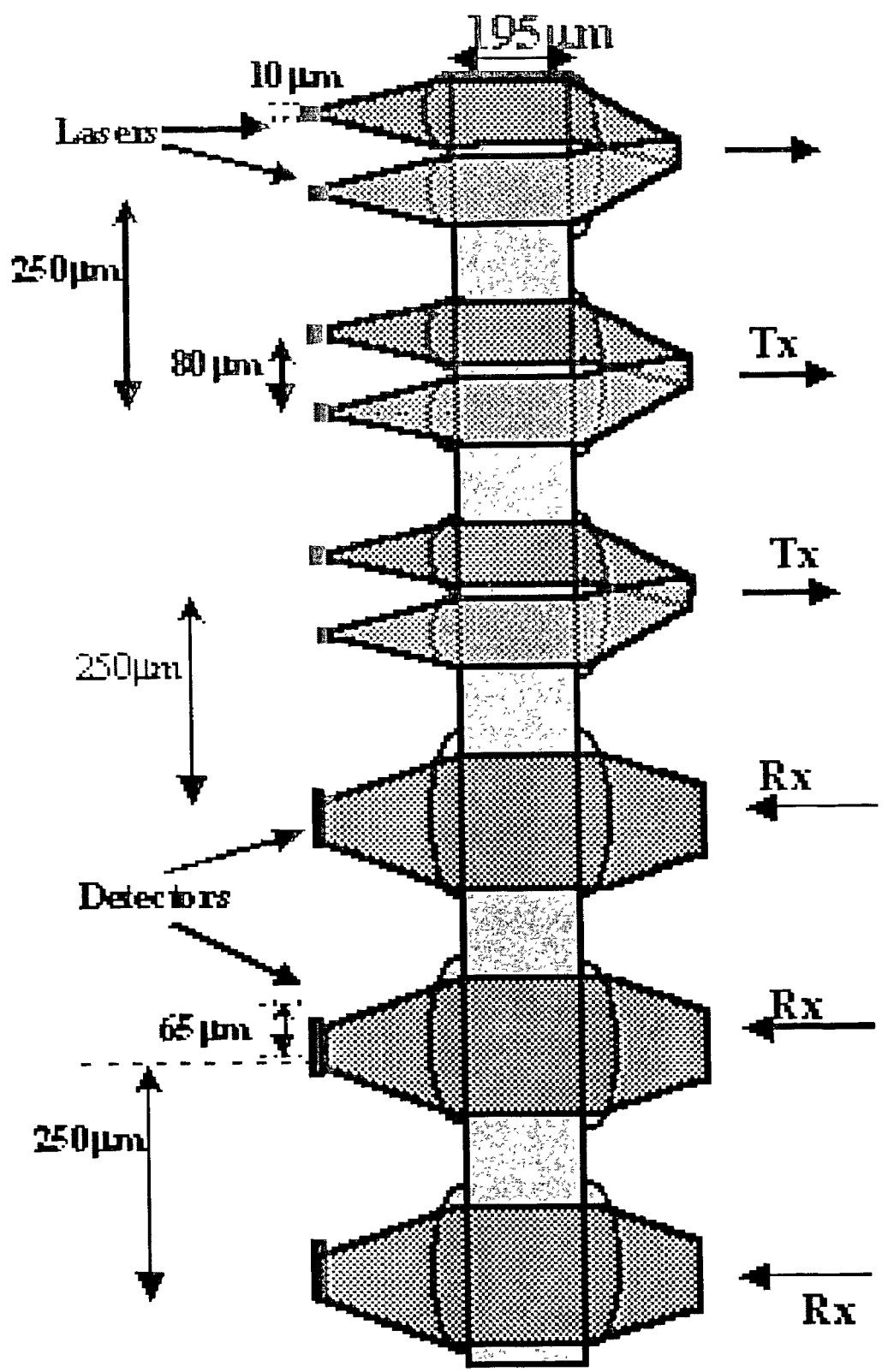

FIGS. 17 through 19 show an example implementation of a system similar to that of FIGS. 14 through 16, except that the lens array 1702 is a compound lens array 1702 having one lens 1704 per laser 1508, 1510, on the emission side 1706 of the array 1702 focussing the light beams to a single, common lens 1708 on the faceplate side 1710. In addition, by using this arrangement, the faceplate 1404 is spaced away from the lens array 1702, whereas in FIGS. 14 through 16, the lens array 1402 and faceplate 1404 abut each other.

FIGS. 20 and 21 show, respectively, a female-format plug (FIG. 20) and a female-format base (FIG. 21) employing an example implementation of a long-throw, tight focussing optical coupler constructed according to the teachings of the invention.

It should now be understood that the analogous approach to using a faceplate can be taken for other variants using an optical window in place of the faceplate. However, in those to variants, since the window slows, but does not effectively eliminate divergence, the use of a lens system (simple or complex) in conjunction with the window may be necessary for some applications.

Finally, in some variants there may be a desire to combine the beams from optical devices, such as multiple lasers, but there is no concern about close approach of another material like a faceplate to other optical devices, such as multiple detectors, on the same chip and optical distance is not a significant problem, then more complex arrangements can be used. For example an optical window or faceplate can be used, without lenses, for some of the optical devices, but not for others, the choice being more related to distance than the piece used.

Figure 22:
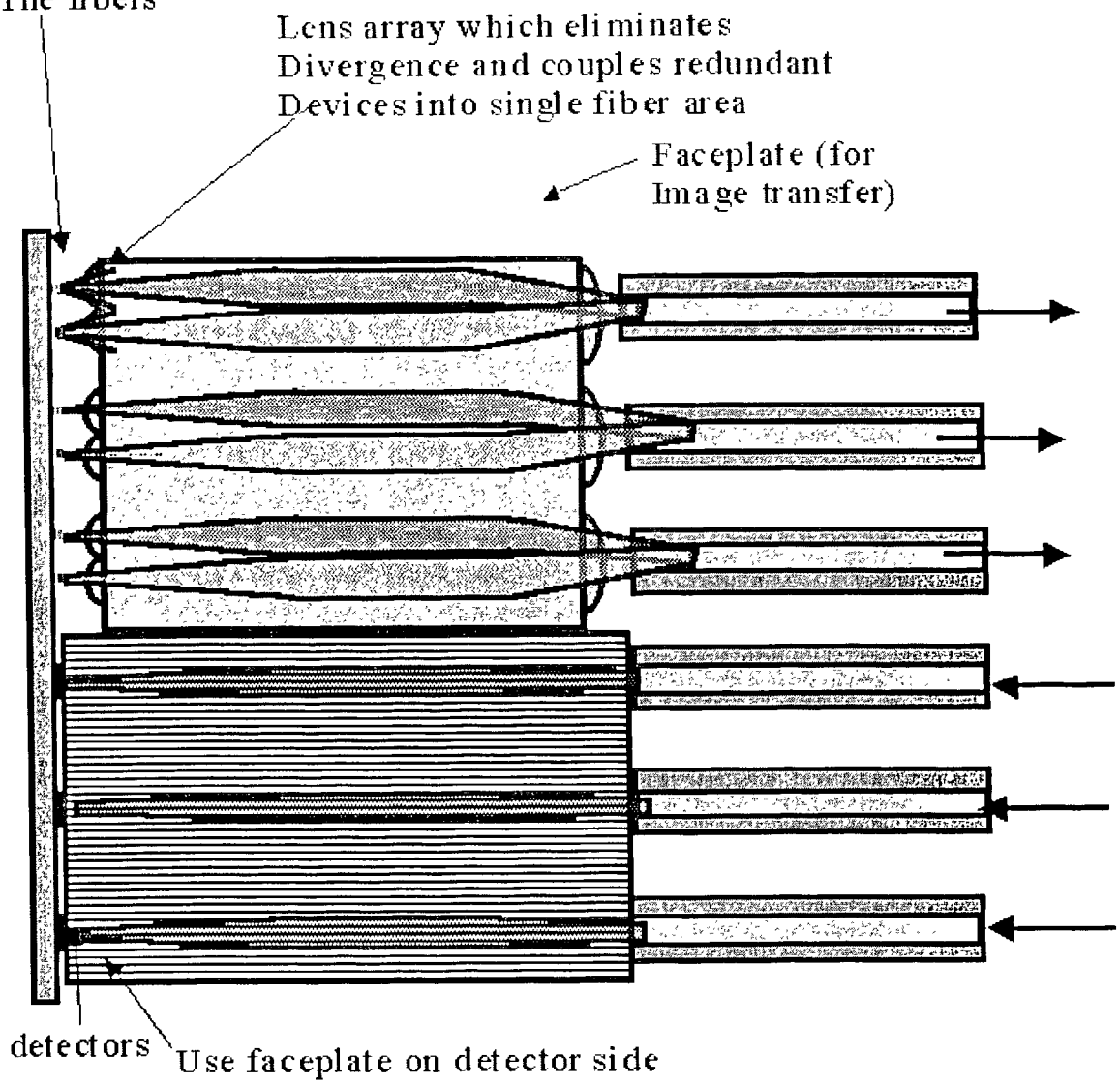
FIG. 22 shows an example of a multiple piece system can be configured according to the teachings of the invention.

In still other variants, a multiple piece system can be configured to create a more complex arrangement, for example, as shown in FIG. 22, using different configurations and combinations of lens arrays, optical windows and/or faceplates. For example, as shown in FIG. 22, the detectors use only a faceplate or an optical window (in this case a faceplate), and the lasers use a combination of microlenses and a faceplate or optical window.

It should be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A long-throw, tight focussing optical coupler for use in a connector having an alignment feature of a length larger than will allow an array of optical sources to couple with an array of optical destinations without crosstalk, the coupler comprising:
   a first passive optical element capable of coupling light between an optical source and an optical destination; and
   a second passive optical element, capable of coupling light between the optical source and the optical destination, located between the first passive optical element and one of the optical source or the optical destination such that, a light beam from the optical source will be transferred to the optical destination when the optical source and optical destination are spaced apart by a distance wherein the distance comprises about the length of a guide pin.

2. A long-throw, tight focussing optical coupler for use in a connector having an alignment feature of a length larger than will allow an array of optical sources to couple with an array of optical destinations without crosstalk, the coupler comprising:
   a first passive optical element capable of coupling light between an optical source and an optical destination; and
   a second passive optical element, capable of coupling light between the optical source and the optical destination, located between the first passive optical element and one of the optical source or the optical destination such that, a light beam from the optical source will be transferred to the optical destination when the optical source and optical destination are spaced apart by a distance wherein the distance comprises a spacing that would result in crosstalk between the light beam from the optical source and another light beam from another optical source.

3. A long-throw, tight focussing optical coupler for use in a connector having an alignment feature of a length larger than will allow an array of optical sources to couple with an array of optical destinations without crosstalk, the coupler comprising:
   a first passive optical element capable of coupling light between an optical source and an optical destination wherein the first passive optical element comprises a complex lens array having more lenses on a side closer to the optical source than on an other side; and
   a second passive optical element, capable of coupling light between the optical source and the optical destination, located between the first passive optical element and one of the optical source or the optical destination such that, a light beam from the optical source will be transferred to the optical destination when the optical source and optical destination are spaced apart by a distance.

4. The long-throw, tight focussing optical coupler of one of claims 1 or 2 wherein the first passive optical element comprises one of a simple lens array, a complex lens array, a faceplate or an optical window.

5. The long-throw, tight focussing optical coupler of one of claims 1, 2 or 3 wherein the second optical element comprises one of a simple lens array, a complex lens array, a faceplate or an optical window different from the first passive element.

6. The long-throw, tight focussing optical coupler of claim 1 wherein the distance comprises a spacing that would result in crosstalk between the light beam from the optical source and another light beam from another optical source.

7. The long-throw, tight focussing optical coupler of claim 6 wherein the first passive optical element comprises one of a simple lens array, a complex lens array, a faceplate or an optical window.

8. The long-throw, tight focussing optical coupler of claim 6 wherein the second optical element comprises one of a simple lens array, a complex lens array, a faceplate or an optical window different from the first passive element.

9. The long-throw, tight focussing optical coupler of one of claims 1 or 2 wherein the first passive optical element comprises a complex lens array having more lenses on a side closer to the optical source than on an other side.

10. The long-throw, tight focussing optical coupler of claim 9 wherein the second optical element comprises one of a simple lens array, a complex lens array, a faceplate or an optical window different from the first passive element.

* * * * *